United States Patent
Hasebe et al.

(10) Patent No.: US 7,504,276 B2
(45) Date of Patent: Mar. 17, 2009

(54) MICRO DEVICE HAVING MICRO SYSTEM STRUCTURE AND METHOD FOR METHOD FOR MANUFACTURING THE SAME

(75) Inventors: Yuta Hasebe, Kariya (JP); Toshiki Ito, Nagoya (JP); Yasutoshi Suzuki, Okazaki (JP)

(73) Assignee: DENSO Corporation, Kariya (JP)

( * ) Notice: Subject to any disclaimer, the term of this patent is extended or adjusted under 35 U.S.C. 154(b) by 479 days.

(21) Appl. No.: 11/196,352

(22) Filed: Aug. 4, 2005

(65) Prior Publication Data
US 2006/0027904 A1 Feb. 9, 2006

(30) Foreign Application Priority Data
Aug. 4, 2004 (JP) .............................. 2004-227841

(51) Int. Cl.
*H01L 21/00* (2006.01)
*H01L 21/31* (2006.01)
(52) U.S. Cl. .............................. 438/53; 438/48; 438/50; 438/778; 257/E21.613
(58) Field of Classification Search ................... 438/48, 438/50, 53, 778; 257/E21.613
See application file for complete search history.

(56) References Cited

U.S. PATENT DOCUMENTS

| | | | |
|---|---|---|---|
| 6,388,310 B1 | 5/2002 | Seto et al. | |
| 7,153,718 B2 * | 12/2006 | Fischer et al. | 438/55 |
| 7,273,764 B2 * | 9/2007 | Reichenbach et al. | 438/52 |
| 7,407,827 B2 * | 8/2008 | Fujii et al. | 438/52 |
| 2004/0075140 A1 * | 4/2004 | Baltes et al. | 257/347 |
| 2004/0253760 A1 * | 12/2004 | Zhang et al. | 438/53 |

FOREIGN PATENT DOCUMENTS

| | | |
|---|---|---|
| JP | A-6-216121 | 8/1994 |
| JP | A-10-153508 | 6/1998 |
| JP | A-2001-44190 | 2/2001 |
| JP | A-2001-85752 | 3/2001 |
| JP | A-2003-17711 | 1/2003 |

* cited by examiner

*Primary Examiner*—Alexander G Ghyka
*Assistant Examiner*—Seahvosh J Nikmanesh
(74) *Attorney, Agent, or Firm*—Posz Law Group, PLC

(57) ABSTRACT

A micro device having a micro system structure includes a protection film disposed on the micro system structure for protecting from a particle. The protection film includes a first protection film having a Vickers hardness equal to or larger than 2500 Hv or a nano indentation hardness equal to or larger than 13.64 GPa. The first protection film has a thickness in a range between 0.1 μm and 30 μm. The protection film has a total stress defined as a product of a film stress and a film thickness, and the total stress is equal to or smaller than 700 N/m.

12 Claims, 7 Drawing Sheets

MICRO DEVICE HAVING MICRO SYSTEM STRUCTURE AND METHOD FOR METHOD FOR MANUFACTURING THE SAME

CROSS REFERENCE TO RELATED APPLICATION

This application is based on Japanese Patent Application No. 2004-227841 filed on Aug. 4, 2004, the disclosure of which is incorporated herein by reference.

FIELD OF THE INVENTION

The present invention relates to a micro device having a micro system structure and a method for manufacturing a micro device.

BACKGROUND OF THE INVENTION

Recently, a micro system structure, i.e., a micro electro mechanical system (MEMS) is used for many products. When the micro system structure is used under atmosphere, in which the structure is exposed to collision of particles such as dust, it is required for the structure to protect from damage of the collision of the particles.

When a film is formed on the micro system structure, the inside stress in the film may cause deformation of the micro system structure so that design of the structure is limited. For example, FIG. 10 shows a micro system structure J2 having a diaphragm J1. The diaphragm J1 is only provided by a thin film. In this structure J2, when compression stress is applied to a part of the thin film diaphragm J1, the diaphragm J1 bends so that the diaphragm J1 is corrugated. Therefore, it is required to design the thin film in such a manner that tensile stress is applied to the thin film diaphragm J1.

In general, a method for protecting the micro system structure J2 is as follows. As shown in FIG. 11A, one method is such that the micro system structure J2 is sealed in a casing J3. Further, another method is such that the micro system structure J2 is sealed by hardening resin material J4, as shown in FIG. 11B. In this case, the micro system structure J2 is inserted into melted resin material J4. Further, as shown in FIG. 11C, gel J5 is applied to the micro system structure J2 so that the structure J2 is protected from outside environment.

However, the above micro system structure cannot be used for detecting environmental temperature and for utilizing chemical reaction caused by environment. This is because the micro system structure is separated from the environment.

Further, to protect the micro system structure J2 with a protection film is as follows. Japanese Patent Application Publication No. H06-216121 discloses a protection film made of a silicon nitride film. U.S. Pat. No. 6,388,310 discloses a protection film made of a silicon oxide film and a silicon nitride film. Japanese Patent Application Publication No. 2001-44190 discloses a protection film made of an organic film and a silicon nitride film. The above protection films improve strength and humidity resistance of the micro system structure. Further, the film has low stress therein.

However, the above protection films do not have high protection function against the collision of particles. Therefore, it is required for the micro system structure to protect from the collision stronger when the micro system structure is mounted in tough circumstance.

SUMMARY OF THE INVENTION

In view of the above-described problem, it is an object of the present invention to provide a micro device having a micro system structure. It is another object of the present invention to provide a method for manufacturing a micro device having a micro system structure.

A micro device having a micro system structure includes: a protection film having a multi-layered structure. The protection film is disposed on the micro system structure for protecting the micro system structure from collision of a particle. The protection film includes a first protection film. The first protection film has a Vickers hardness equal to or larger than 2500 Hv or a nano indentation hardness equal to or larger than 13.64 GPa. The nano indentation hardness is measured by a Berkovich tip with applying load of 0.5 gf. The first protection film has a thickness in a range between 0.1 μm and 30 μm. The protection film has a total stress defined as a product of a film stress and a film thickness. The total stress of the protection film is equal to or smaller than 700 N/m.

In the device, the protection film protects the micro system structure so that the micro device can be used in an environment in which a particle may collide with the micro device. Further, the protection film has low stress therein.

Further, a micro device having a micro system structure includes: a protection film including a first protection film and a second protection film for protecting the micro system structure from collision of a particle. The first protection film is disposed on the micro system structure through the second protection film. The second protection film has a fluidizing temperature, which is lower than that of the first protection film. The first protection film has a nano indentation hardness defined as Ha in kgf/m², which satisfies a following relationship:

$$Ha > c' \cdot \frac{d^3 \cdot \rho \cdot v^2}{h^3 \cdot \varepsilon_B}.$$

The nano indentation hardness is obtained by using a Berkovich tip with applying load of 0.5 gf. c' in the relationship represents a constant in a range of $5.5 \times 10^{-6} \leq c' \leq 7.6 \times 10^{-6}$. The d in meter represents a dimension of the particle. The ρ in kg/m³ represents a density of the particle. The v in m/s represents a collision velocity of the particle. The h in meter represents a thickness of the first protection film. The $\varepsilon_B$ represents a yielding strain of the first protection film.

In the device, the protection film protects the micro system structure so that the micro device can be used in an environment in which a particle may collide with the micro device. Further, the protection film has low stress therein.

Further, a micro device having a micro system structure includes: a first protection film for protecting the micro system structure from collision of a particle. The particle has a dimension of d in meter, a density of ρ in kg/m³ and a collision velocity of v in m/s. The first protection film has a thickness of h in meter. The first protection film is made of material having a yielding strain of $\varepsilon_B$ and a nano indentation hardness of Ha in kgf/m². The nano indentation hardness is obtained by using a Berkovich tip with applying load of 0.5 gf. The nano indentation hardness of the first protection film satisfies a following relationship:

$$Ha > c' \cdot \frac{d^3 \cdot \rho \cdot v^2}{h^3 \cdot \varepsilon_B}.$$

The c' in the relationship represents a constant in a range of $5.5 \times 10^{-6} \leq c' \leq 7.6 \times 10^{-6}$.

In the device, the protection film protects the micro system structure so that the micro device can be used in an environment in which a particle may collide with the micro device. Further, the protection film has low stress therein.

Further, a method for manufacturing a micro device having a micro system structure includes the steps of: forming the micro system structure on a support substrate; and forming a first protection film on the micro system structure. The first protection film is formed by a PVD method, a CVD method, an ion plating method, an evaporation method, an ALD method, a spin coating method, or a printing method so that the first protection film protects the micro system structure from collision of a particle. The particle has a dimension of d in meter, a density of $\rho$ in kg/m$^3$ and a collision velocity of v in m/s. The first protection film has a thickness of h in meter. The first protection film is made of material having a yielding strain of $\epsilon_B$ and a nano indentation hardness of Ha in kgf/m$^2$. The nano indentation hardness is obtained by using a Berkovich tip with applying load of 0.5 gf. The nano indentation hardness of the first protection film satisfies a following relationship:

$$Ha > c' \cdot \frac{d^3 \cdot \rho \cdot v^2}{h^3 \cdot \epsilon_B}.$$

The c' in the relationship represents a constant in a range of $5.5 \times 10^{-6} \leq c' \leq 7.6 \times 10^{-6}$.

The above method provides the device. In the device, the protection film protects the micro system structure so that the micro device can be used in an environment in which a particle may collide with the micro device. Further, the protection film has low stress therein.

Preferably, the method further includes the steps of: forming a second protection film on the micro system structure before the step of forming the first protection film; heating the first and the second protection films up to a predetermined temperature after the step of forming the first protection film; and cooing the first and the second protection films down to a room temperature. The second protection film has a fluidizing temperature, which is lower than that of the first protection film. The first protection film is formed on the second protection film. The predetermined temperature in the step of heating the first and the second protection films is equal to or higher than the fluidizing temperature of the second protection film.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
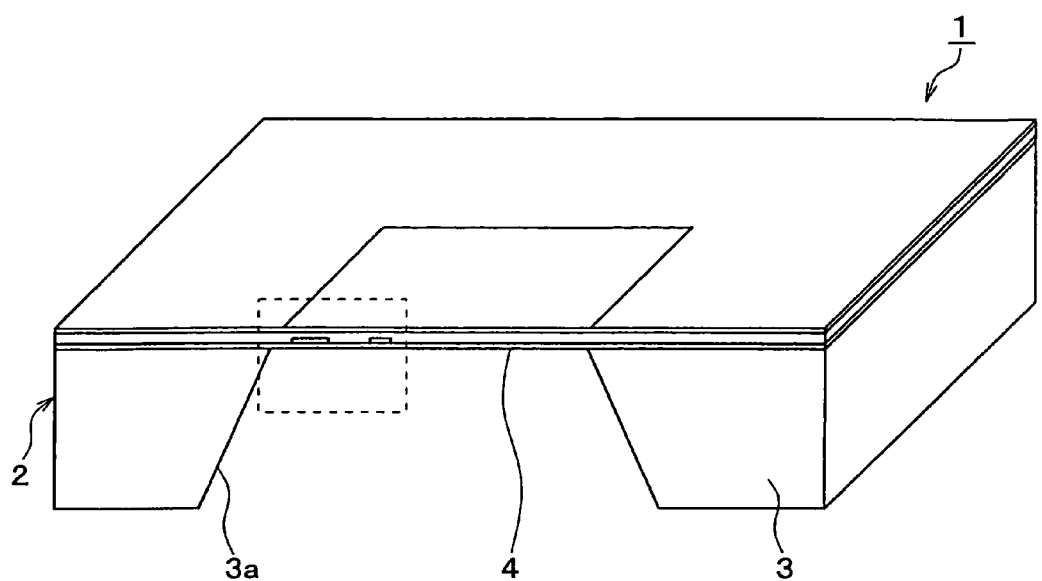
FIG. 1 is a perspective view showing a micro device according to a first embodiment of the present invention.
Figure 2:
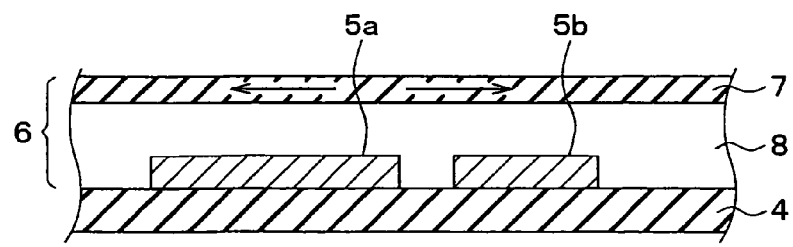
FIG. 2 is a partially enlarged cross sectional view showing a part of the device surrounded with a broken line in FIG. 1.

Micro device 1 having a protection film 6 according to a first embodiment of the present invention is shown in FIGS. 1 and 2.

The micro device 1 includes a micro system structure 2 having a thin film diaphragm 4, which is composed of a silicon substrate 3 and a concavity 3a. The concavity 3a is formed on a backside of the substrate 3. The thin film diaphragm 4 is formed of a silicon nitride film. Further, as shown in FIG. 2, an integrated circuit 5a including a gauge resistor is disposed on the foreside of the silicon substrate 3. Furthermore, an extraction electrode 5b for an external circuit is also formed on the foreside of the substrate 3.

A protection film 6 is formed on the foreside of the substrate 3. The protection film 6 includes the first protection film 7 and the second protection film 8. Thus, the micro device 1 having the protection film 6 is formed.

The first protection film 7 is made of, for example, metallic oxide, boride, nitride, oxide, or carbide. Specifically, the first protection film 7 is made of DLC (i.e., diamond like carbon), CBN, TiC, SiC, CrN, TiCN, TiN, TiAlN, SiON, or SiN.

The second protection film 8 is made of, for example, organic material, silicon oxide, or metallic oxide. Specifically, the second protection film 8 is made of organic material such as poly-imide, polyamide-imide, epoxy, fluorocarbon resin, and thermoplastic poly-imide. Further, the film 8 can be made of silicon oxide such as low melting glass, soda glass, and SiO$_2$, or other oxides such as lead oxide, Silica, boron oxide, and tin oxide. Furthermore, the second protection film 8 can be formed of composite material composed of the above materials.

The protection film 6 including the first and the second protection films 7, 8 satisfies the following relationship so that the protection film 6 protects the micro system structure 2 sufficiently from collision of particles when the micro device 1 is mounted in tough environment. Specifically, in the tough environment, particles may collide with the micro device 1.

When a particle collides with a body, an impact scar, i.e., a collision damage is generated on the surface of the body. In this case, even when the body is covered with a protection film, the collision causes distortion of the protection film. Here, the distortion exceeds elastic deformation of the protection film. This permanent distortion is occurred at a tiny region of the protection film. Thus, this means destruction of the protection film. Accordingly, when the protection film 6 includes at least a part of the film 6 for preventing from applying the collision damage in a case where a particle collides with the film 6, the micro system structure 2 is protected from damage of the collision of the particle. In the first embodiment, the first protection film 7 works as the part of the film 6 for preventing the device 1 from applying the collision damage.

Here, the collision damage is applied to the film when the following relationship is satisfied. Specifically, when the following formula satisfies, the collision damage is applied to the film in a case where the distortion of the protection film 6 caused by the collision of the particle exceeds a yield strain of material composing the film 6.

$$c \cdot \frac{a}{h} < \varepsilon_B \tag{F1}$$

Here, $\varepsilon_B$ represents the yield strain of the material composing the protection film 6. The distortion of the protection film 6 is defined as amount of deformation of the material, i.e., $c \cdot a/h$. In this formula F1, a [m] represents amount of pushing the particle into the material. h [m] represents a thickness of the protection film 6 when no distortion is occurred in the protection film 6. c represents a constant.

Figure 3:
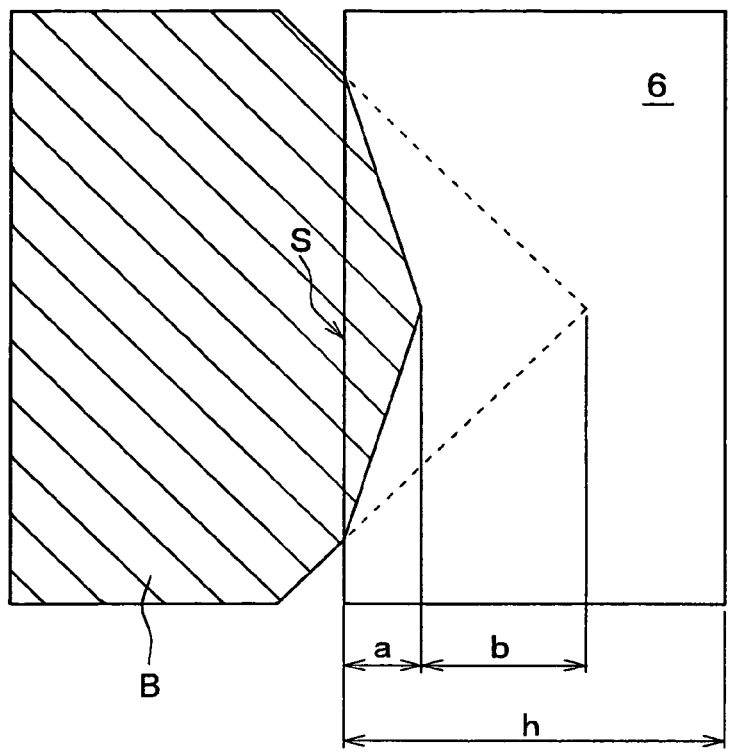
FIG. 3 is a schematic cross sectional view explaining collision of a particle to a protection film, according to the first embodiment.

A model case where the particle collides the protection film 6 is shown in FIG. 3. For example, the particle B having a sharp pointed tip collides with the protection film 6 having the thickness of h. At this collision, the protection film 6 is pushed inside by the amount of deformation a. Then, the tip of the particle B crushes by a dimension b so that the length of the tip is shortened by the dimension b. Here, the weight of the particle B is defined as m [kgf], the velocity of the particle B is defined as v [m/s], and the diameter of the particle B is defined as d [m]. The degree of hardness of the protection film 6 is defined as Ha [kgf/m²], and the degree of hardness of the particle B is defined as Hb [kgf/m²]. The contact area between the protection film 6 and the particle B is defined as S [m²].

In this case, the dynamic equation of the collision between the particle B and the protection film 6 is described as follows:

$$\frac{1}{2} \cdot m \cdot v^2 = \frac{1}{2} \cdot c \cdot (S \cdot Ha \cdot a + S \cdot Hb \cdot b) \tag{F2}$$

Figure 4:
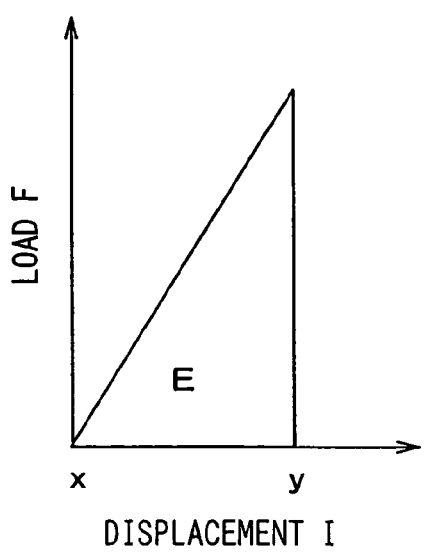
FIG. 4 is a graph showing a relationship between strain, i.e., displacement of material and load, according to the first embodiment.

The above formula F2 is obtained by balance between collision energy of the particle B and deformation energy between the particle B and the protection film 6. Here, the deformation energy is defined as an integration value of a product of the weight and the amount of strain of material integrated in a range of strain region. When the material is elastically deformed, as shown in FIG. 4, the amount of strain of the material is in proportion to the load. Therefore, the strain energy is calculated by the right-hand side of the formula F2.

Figure 5:
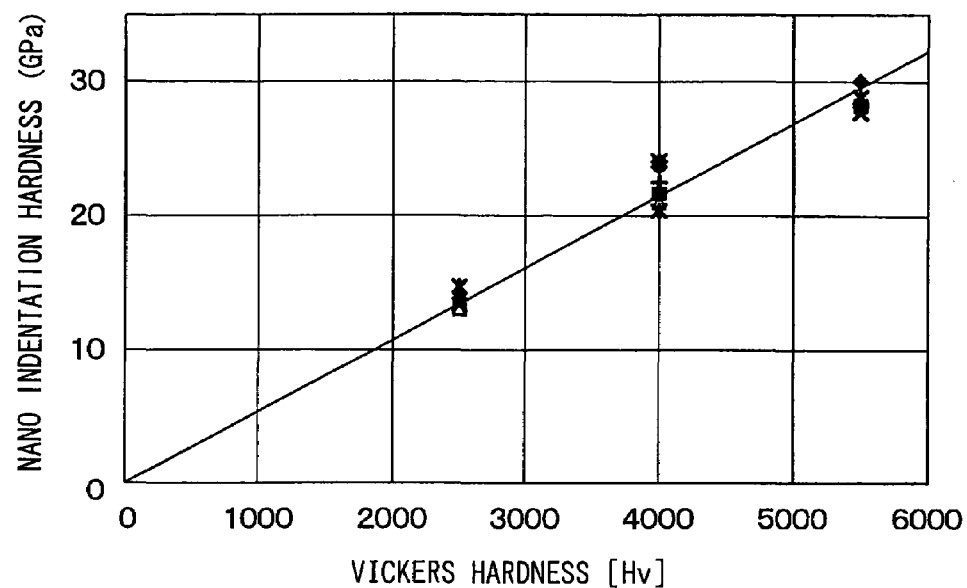
FIG. 5 is a graph showing a relationship between nano-indentation hardness and Vickers hardness, according to the first embodiment.

When the particle B collides with the protection film 6, the sharp-pointed tip of the particle B is pressed into the protection film 6. In this case, the load is applied to the protection film 6 with the sharp-pointed tip. Thus, it is appropriate that the load is represented as a representative value using the hardness, which is obtained by standardizing the load and the contact area when the sharp-pointed tip is pressed into the material. Thus, the deformation energy is obtained by a value of product of the hardness, the contact area of the particle B, the amount of deformation and the constant, i.e., Ha×S×a×c. The hardness is measured by a nano-indentation method, which is suitably used for measuring hardness of a micro region. Specifically, a Berkovich tip is used for the nano-indentation method, and the load of 0.5 gf is applied to the material. Further, the hardness of the same standard sample is measured by a Vickers hardness test as a standard measuring method of Japanese Industrial Standards, i.e., JIS. Then, the hardness measured by the nano-indentation method (i.e., the nano-indentation hardness) and the hardness measured by the Vickers hardness test (i.e., the Vickers hardness) are compared. As shown in FIG. 5, the hardness measured by the nano-indentation method is in proportion to the hardness measured by the Vickers hardness test.

The formula F2 is transformed so that the amount of deformation a is obtained. Further, the amount of deformation a is substituted for the formula F2. Then, the formula F2 is transformed to obtain the hardness Ha of the protection film 6, so that the formula F3 is obtained.

$$\frac{1}{2} \cdot m \cdot v^2 = \frac{1}{2} \cdot c \cdot (S \cdot Ha \cdot a + S \cdot Hb \cdot b) \tag{F2}$$

$$\frac{a}{b} \approx \frac{Ha}{Hb}$$

$$\therefore mv^2 = c \cdot S \cdot a(Ha + Hb)$$

$$a = \frac{mv^2}{c \cdot S \cdot Ha}$$

$$a = \frac{\frac{\pi}{6} \cdot d^3 \cdot \rho \cdot v^2}{c' \cdot h^2 \cdot Ha} = c'' \cdot \frac{d^3 \cdot \rho \cdot v^2}{h^2 \cdot Ha}$$

$$\therefore c \cdot \frac{a}{h} = c''' \cdot \frac{d^3 \cdot \rho \cdot v^2}{h^3 \cdot Ha} < \varepsilon_B$$

$$Ha > c' \cdot \frac{d^3 \cdot \rho \cdot v^2}{h^3 \cdot \varepsilon_B} \tag{F3}$$

Here, the constant c' satisfies following relationship:

$$5.5 \times 10^{-6} \leq c' \leq 7.6 \times 10^{-6}.$$

In the above transformation, specifically, in the transformation of the formula F2, the following values are substituted for not directly measured values in the formula F2.

$$S\ [m^2] \times c = c' \times h^2\ [m^2]$$

$$m\ [kg] \gg \frac{\pi}{6} \times d^3 \times \rho\ [kg]$$

Here, the contact area S [m²] is obtained by a product of a square of the thickness of the protection film 6 and the constant. The weight m [kg] of the particle B is obtained by a product of the volume of the particle B and the density of the particle B. The volume of the particle is estimated by a volume of a sphere having a diameter of the particle B. The constants c', c'', c''' have the relationships of $$c'' = \frac{\pi}{6 \times c'}$$

and c'''=c×c''.

Next, a collision test is performed in such a manner that a standard particle for a standard test of JIS collides the protection film 6. According to the result of this test, the constant c in the formula F2 is estimated. Using this estimation, the dimensions and the weight of the particle B, the hardness and the thickness of the protection film 6 for preventing the collision damage of the particle B having certain dimensions and certain weight are determined.

Figure 6:
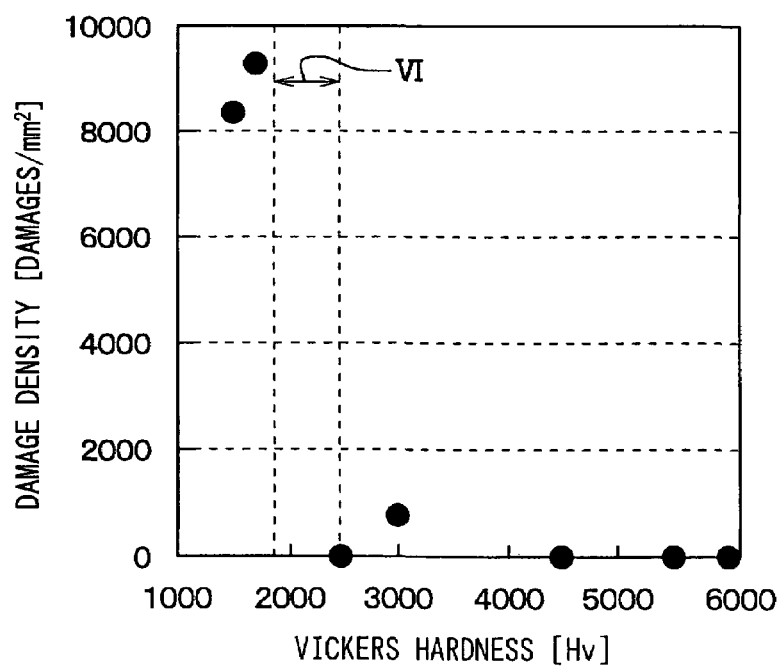
FIG. 6 is a graph showing a relationship between density of damages and Vickers hardness, according to the first embodiment.

For example, the hardness Ha of the protection film 6 is obtained by the formula F2 in a case where the protection film 6 is protected from the particle made of natural quartz, which is a main component of the particle B in atmosphere. For example, the particle B has the density of 2.2 g/cm$^2$, the size of 100 μm and the velocity of 40 m/s. In this case, a condition for not making a collision damage on the protection film 6 is calculated as follows. Here, the thickness of the protection film 6 is 0.1 μm, and the yield strain of the protection film 6 is 0.03. When the Vickers hardness of the protection film 6 is equal to or higher than 1800 Hv to 2500 Hv, or when the hardness measured by the nano-indentation method is equal to or higher than 9.8 GPa to 13.6 GPa, the protection film 6 is prevented from the collision damage. FIG. 6 shows results of a test, in which a standard test particle having the first grade test particle of JIS collides the protection film 6. Specifically, the particle is selected to be equal to or smaller than 100 μm, and the particle has velocity of 40 m/s. In this case, the number of collision damages on the protection film 6 is measured. FIG. 6 shows a relationship between the collision damage density (in damages per mm$^2$) and the Vickers hardness (in Hv) of the protection film 6. The number of the collision damages of the particles is reduced by two digits and more on reaching the Vickers hardness of 2000 Hv. In FIG. 6, a region VI represents a boundary of the Vickers hardness calculated by the formula F3, i.e., the region VI shows the Vickers hardness in a range between 1800 Hv and 2500 Hv.

The inventors have performed further experiments. The results shows that the protection film 6 preferably includes a part of the film 6 having the thickness in a range between 0.1 μm and 30 μm and the Vickers hardness equal to or higher than 2500 Hv or the nano-indentation hardness equal to or higher than 13.64 GPa. In this case, the protection film 6 is protected from the particle made of natural quartz, which is a main component of the particle in the atmosphere. Here, the nano-indentation hardness is measured with using the Berkovich tip having the load of 0.5 gf.

In this embodiment, the first protection film 7 in the protection film 6 satisfies the above conditions.

Here, it is not preferred that the protection film 6 has the Vickers hardness lower than 2500 Hv or the nano-indentation hardness lower than 13.64 GPa, since the particle may damage the protection film 6 so that the micro system structure 2 is damaged. Further, it is not preferred that the protection film has the thickness thinner than 0.1 μm, since the particle may damage the protection film 6 so that the micro system structure 2 is damaged. Furthermore, it is not preferred that the thickness of the protection film 6 is thicker than 30 μm, since homogeneity of the film thickness of the protection film 6 becomes lower. Accordingly, the first protection film 7 has the thickness in a range between 0.1 μm and 30 μm, and having the Vickers hardness equal to or larger than 2500 Hv or the nano-indentation hardness equal to or larger than 13.64 GPa.

Further, the total stress applied to the protection film 6 is equal to or lower than 700 N/m, and the total stress is a compressive stress. It is required that the thin film diaphragm 4 is designed to have the total stress in a tensile direction. For example, a SiN film formed by a LP-CVD method generates a tensile direction stress. This SiN film has the stress in a range between −1 GPa and 1.4 GPa. Therefore, when the thickness of the SiN film is 0.5 μm, the total stress is, in general, in a range between 500 N/m and 700 N/m. Thus, when the protection film 6 is made of the SiN film having the tensile direction stress, the total stress of the protection film 6 in the compressive direction is equal to or smaller than 700 N/m.

To increase the total stress of the protection film 6 made of the SiN film to be equal to or larger than 700 N/m, it is required to stack the SiN film repeatedly for generating the tensile stress. However, in this case, the manufacturing steps of the micro system structure increases, so that the manufacturing cost of the structure becomes higher. Therefore, it is not preferable.

Accordingly, it is preferred that the total stress of the protection film 6 is smaller than 700 N/m. The first protection film 7 in the protection film 6 satisfies this condition.

However, if the film stress as a membrane stress of the film 7 is smaller than −1 GPa or larger than 4 GPa, the film stress may damage the micro system structure 2. Therefore, it is preferred that the film stress of the first protection film 7 is in a range between −1 GPa and 4 GPa.

In the structure 2, the protection film 6 is formed of a stacked film, i.e., a multi-layer film having the first and the second protection films 7, 8. In this case, it is preferred that the second protection film 8 is made of material having a threshold temperature, at which the material cannot hold its continuum. The threshold temperature of the second protection film 8 is lower than that of the first protection film 7. Here, the threshold temperature is, for example, a glass transition temperature of the second protection film or a fluidizing temperature of the second protection film 8. The second protection film 8 is disposed under the first protection film 7. In this case, when the protection film 6 is heated up to a predetermined temperature, which is higher than the threshold temperature of the second protection film 8, the second protection film 8 becomes fluid, i.e., the film 8 has the fluidity, so that the strain in the first protection film 7 is released. Thus, the stress in the first protection film 7 is reduced.

Although the protection film 6 includes single first protection film 7 and single second protection film 8, the protection film 6 can include multiple first protection films 7 and multiple second protection films 8. This construction is effective in a case where a target film thickness is not obtained by single layer first protection film 7 and single layer second protection film 8. This is because the thickness of the single layer first protection film 7 is limited by the film stress and the like when the first protection film 7 is made of some kind of material. Therefore, in this case, the first and the second protection films 7, 8 are stacked repeatedly. Then, the protection film 6 having multiple first protection films 7 and multiple second protection films 8 is heated up to a temperature higher than the threshold temperature of the second protection film 8 so that the protection film 6 is provided. Further, the strain of the first protection film 7 is released so that the area of the films 6 expands. At this time, the first protection film 7 receives resistance of shear stress caused by viscosity of fluidized second protection film 8. This shear stress is in proportion to an area of the first protection film 7 covering the second protection film 8. Therefore, it is preferred that the first protection film 7 is divided into multiple portions so that the stress of the first protection film 7 is easily released.

Figure 7:
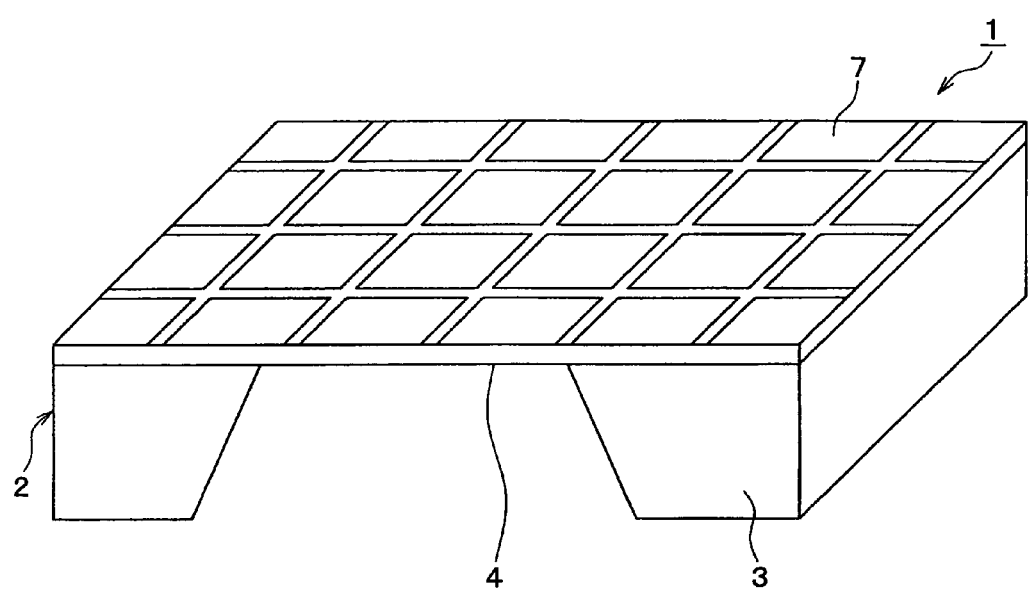
FIG. 7 is a perspective view showing the first protection film having multiple polygonal parts, according to a modification of the first embodiment.

Thus, as shown in FIG. 7, the first protection film 7 is divided into multiple polygonal parts, each of which is separated each other. The periphery of each polygonal part is apart from each other by a predetermined distance in a range between 1 μm and 100 μm. For example, as shown in FIG. 7, the first protection film 7 is divided into multiple square parts.

Here, when the area of the polygonal part of the first protection film 7 is smaller than 1 μm$^2$, the polygonal part may be displaced when the protection film 6 is heated up to the temperature equal to or higher than the threshold temperature of the second protection film 8. Further, when the area of the polygonal part of the first protection film 7 is larger than 25 mm², the stress of the first protection film 7 is not sufficiently released, since the area is too large. Thus, it is preferred that the area of the polygonal part is in a range between 1 μm² and 25 mm².

Further, it is preferred that the thickness of the second protection film 8 is in a range between 0.1 μm and 100 μm. In this case, the strain of the first protection film 7 is effectively released when the protection film 6 is heated up to the temperature equal to or higher than the threshold temperature of the second protection film 8. Specifically, when the thickness of the second protection film 8 is smaller than 0.1 μm, the strain of the first protection film 7 is not released sufficiently when the protection film 6 is heated up to the temperature equal to or higher than the threshold temperature of the second protection film 8. This is because the surface concavity and convexity of the micro system structure 2 prevents the displacement of the second protection film 8 so that the second protection film 8 is not sufficiently displaced. Further, when the thickness of the second protection film 8 is larger than 100 μm, the thick protection film 6 may affect the physical properties of the micro system structure 2 such as mechanical property and thermal property. Therefore, it is preferred that the thickness of the second protection film 8 is in a range between 0.1 μm and 100 μm.

Thus, the protection film 6 surely protects the micro system structure 2 from the collision of the particle B, even if the micro system structure 2 is disposed in environment where the particle B having the dimensions equal to or smaller than 200 μm and the velocity equal to or lower than 50 m/s may collide with the micro system structure 2.

Next, a method for manufacturing the micro device 1 having the protection film 6 is described as follows.

Figure 8A:
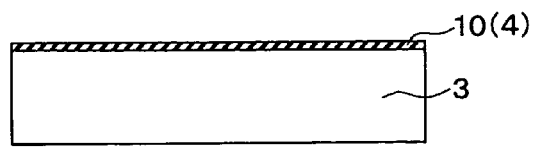
FIGS. 8A to 8H are cross sectional views explaining a method for manufacturing the device according to the first embodiment.

Firstly, as shown in FIG. 8A, the silicon substrate 3 as a support substrate is prepared. Then, a SiN film 10 is formed on the silicon substrate 1 by the LP-CVD method. The SiN film 10 has the membrane stress of about −1 GPa. A part of this SiN film 10 provides the thin film diaphragm 4.

Figure 8B:
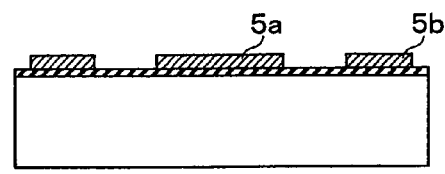

As shown in FIG. 8B, a function element (not shown), the integrated circuit 5a as a semiconductor IC and the extraction electrode 5b are formed on the SiN film 10 by using film deposition method and a patterning process. Thus, the micro system structure 2 is formed.

Figure 8C:
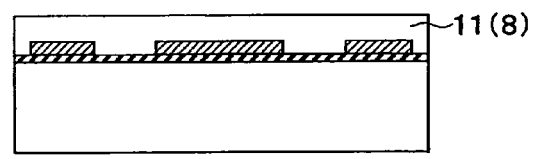

Then, the protection film 6 is formed to cover the function element, the integrated circuit 5a and the extraction electrode 5b. Specifically, as shown in FIG. 8C, a poly-amide imide film 11 as the second protection film 8 is coated on the substrate 3 by a spin coating method. Then, the substrate 3 is heated at 180° C. during one hour so that the second protection film 8 having the thickness in a range between 0.1 μm and 30 μm. Here, the poly-amide imide film 11 has a glass transition temperature of about 250° C., in general. Thus, when the poly-amide imide film 11 is heated up to the temperature equal to or higher than the glass transition temperature, the continuum of the film 11 is not maintained.

Figure 8D:
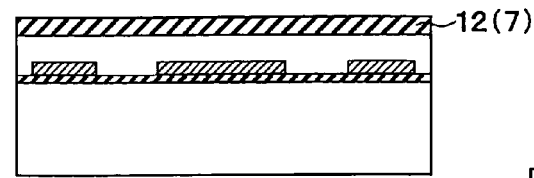

Then, a DLC (i.e., diamond like carbon) film 12 as the first protection film 7 is deposited on the second protection film 8 by an evaporation method, as shown in FIG. 8D. Here, the DLC film 12 is formed in such a manner that the DLC film 12 has the Vickers hardness equal to or larger than 2500 Hv or the nano-indentation hardness equal to or larger than 13.64 GPa, has the thickness in a range between 0.1 μm and 30 μm, and has the total stress equal to or lower than 700 N/m. Thus, the first and the second protection films 7, 8 are formed.

Figure 8E:
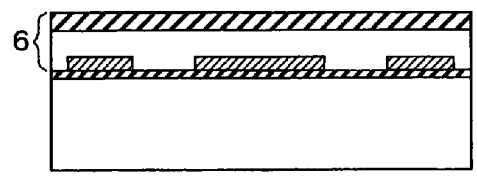

As shown in FIG. 8E, the substrate 3 is heated up to 300° C. during two hours so that the strain in the first protection film 7 is released. Here, 300° C. is higher than the glass transition temperature of the second protection film 8 made of the poly-amide imide film. This strain release condition having the heating temperature of 300° C. and the heating time of two hours is optimized. Because the necessary temperature and the necessary process time for releasing strain sufficiently are different when the material composing the first protection film 7 and the manufacturing conditions of the first protection film 7 are different. Further, the first protection film 7 can be divided into multiple polygonal parts, each of which is separated each other, so that the strain in the first protection film 7 is easily released. Here, the area of each polygonal part is optimized.

Next, the micro system structure 2, which has high temperature, is cooled down to the room temperature. Thus, the strain releasing process of the first protection film 7 is finished so that the protection film 6 is formed.

Figure 8F:
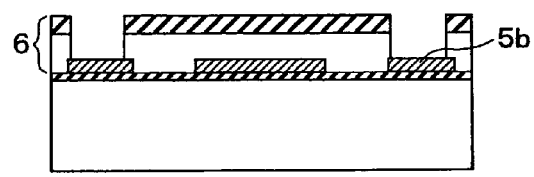

After the protection film 6 is formed, as shown in FIG. 8F, a part of the protection film 6 disposed on the extraction electrode 5b for connecting between the structure 2 and the external circuit is removed by the photo-lithography method and the dry etching method.

Figure 8G:
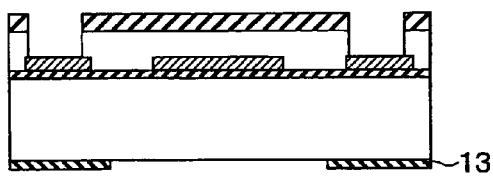

Then, the thin film diaphragm is formed on the substrate 3. Specifically, as shown in FIG. 8G, an etching mask 13 is formed on the backside of the substrate 3. For example, a SiO₂ film or a SiN film is deposited on the substrate 3. Then, a part of the etching mask 13 is removed by the photo-lithography method and the etching method. Here, the part of the etching mask 13 is disposed on a thin-film-diaphragm-to-be-formed portion.

Figure 8H:
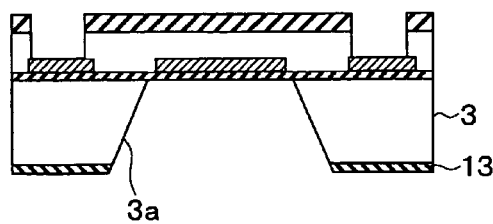

As shown in FIG. 8H, the substrate 3 is etched from the backside of the substrate 3 by an anisotropic etching method with using KOH or TMAH alkali solution. Thus, the substrate 3 is etched so that the concavity 3a reaches the SiN film 10 disposed on the foreside of the substrate 3. The thin film diaphragm structure having the protection film 6 is formed. Then, the substrate 3 is divided into multiple chips so that the micro device 1 is completed.

Second Embodiment

Figure 9:
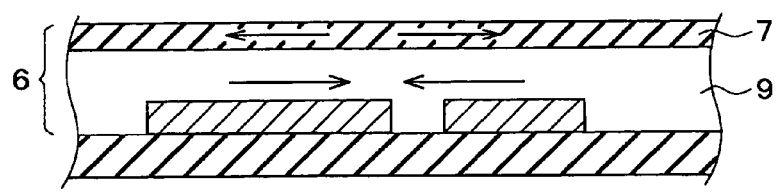
FIG. 9 is a partially enlarged cross sectional view showing a part of a micro device according to a second embodiment of the present invention.
Figure 10:
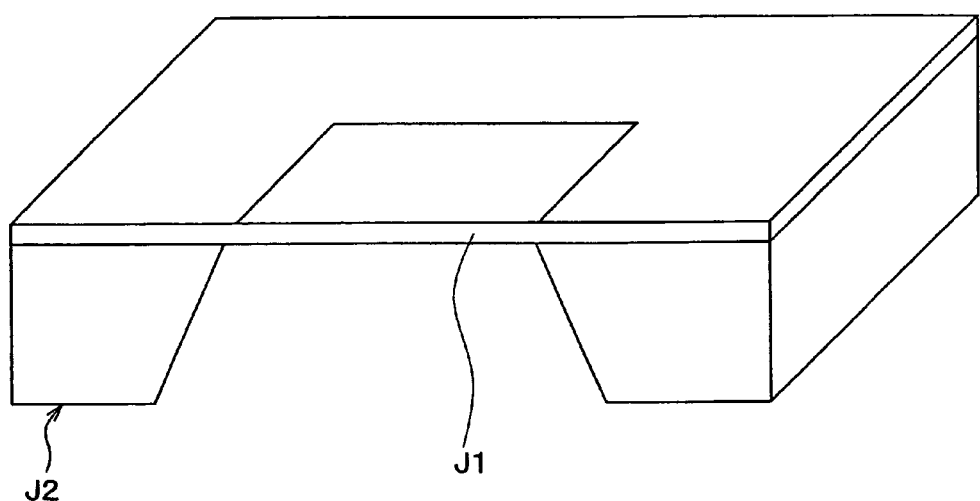
FIG. 10 is a perspective view showing a micro device according to a prior art.
Figure 11A:
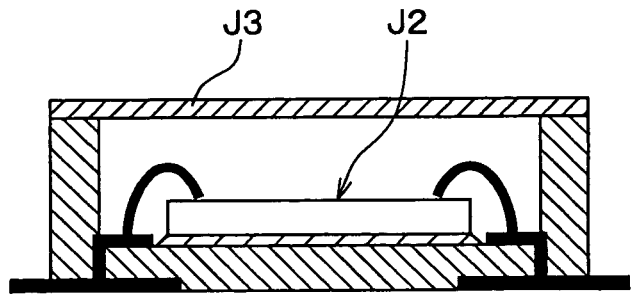
FIGS. 11A to 11C are cross sectional views showing micro devices according to the prior art.
Figure 11B:
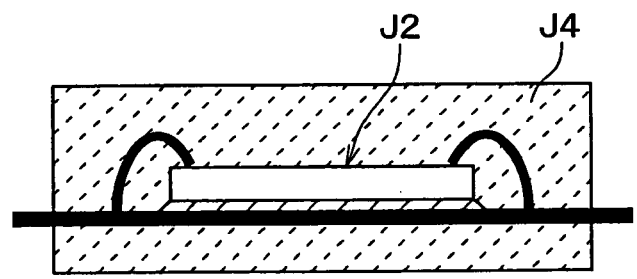
Figure 11C:
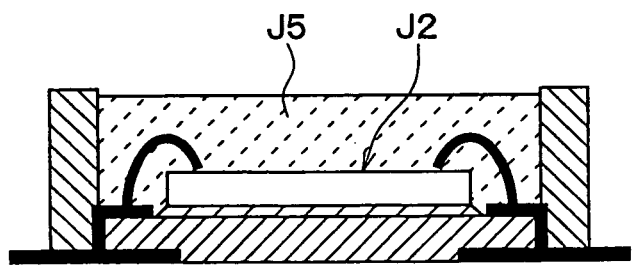

A micro device 1 according to a second embodiment of the present invention is shown in FIG. 9. The device 1 includes the third protection film 9 instead of the second protection film 8. The third protection film 9 is made of organic material, metallic material, silicon oxides, silicon nitrides, or silicon carbides. For example, the third protection film 9 is made of poly-imide, poly-amide imide, epoxy, fluorin resin, thermoplastic poly-imide, Al₂O₃, SiO₂, SiN, TiC, SiC, TiCN, TiN, TiAlN, or SiON. Further, the third protection film 9 is formed by a PVD method, a CVD method, an evaporation method, an ion plating method, or a coating method. Here, in the coating method, a mixture of the material composing the third protection film 9 or a mixture of precursor of the third protection film 9 is applied to the substrate 3, and then, the mixture is dried and sintered. Further, the third protection film 9 can be formed by a combination of the above methods.

The third protection film 9 has tensile stress. Specifically, since the first protection film 7 has large hardness, the compressive stress is applied to the third protection film 9. However, the first protection film 7 has large compressive stress so that the total stress of the whole thin film diaphragm is along with the tensile direction.

In this case, it is preferred that the thickness of the third protection film 9 is in a range between 0.1 μm and 100 μm.

Further, preferably, the film stress of the third protection film 9 is designed to be in a range between −1.4 GPa and 0 GPa. These reasons are the same as the reasons described in the first embodiment regarding the first protection film 7.

(Modifications)

Although the second protection film 8 is applied by the spin coating method, and the first protection film 7 is deposited by the evaporation method, the first or the second protection film 7, 8 can be formed by other methods. For example, the first protection film 7 can be formed by a PVD method, a CVD method, an ion plating method, an evaporation method, a spin coating method, a printing method, or a coating method. Here, in the coating method, a mixture of the material composing the first protection film 7 or a mixture of precursor of the first protection film 7 is applied to the substrate 3, and then, the mixture is dried and sintered. Further, the first protection film 7 can be formed by a combination of the above methods.

Further, the second protection film 8 can be formed by a PVD method, a CVD method, an ion plating method, an evaporation method, or a coating method. Here, in the coating method, a mixture of the material composing the second protection film 8 or a mixture of precursor of the second protection film 8 is applied to the substrate 3, and then, the mixture is dried and sintered. Further, the second protection film 8 can be formed by a combination of the above methods.

Although the micro device 1 includes the micro system structure 2 with the thin film diaphragm 4, the micro device 1 can include a semiconductor integrated circuit formed by a patterning method of a thin film, a three dimensional structure formed by an etching method of silicon, and an element formed by a solidification method with using light irradiation to photo sensitive material such as photo sensitive resin.

The above micro device 1 is formed by, for example, an impurity implantation process to the substrate 3, a thin film deposition process, an exposure process, a development process, an etching process, and a silicon micro machining process. Then, the protection film 6 is formed on the substrate 3 by a PVD method, a CVD method, an ion plating method, an evaporation method, an ALD method, a spin coating method, or a printing method. Thus, the micro device 1 having the protection film 6 is completed.

Further, the micro system structure can provide a semiconductor integrated circuit. Further, the micro system structure can provide a three dimensional structure. Further, the micro system structure provides a three dimensional structure made of photo sensitive resin. 8. Further, the micro system structure can provide a thin film diaphragm.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a micro device having a micro system structure, the method comprising the steps of:
   forming the micro system structure on a support substrate; and
   forming a first protection film on the micro system structure, wherein
      the first protection film is formed by a PVD method, a CVD method, an ion plating method, an evaporation method, an ALD method, a spin coating method, or a printing method so that the first protection film protects the micro system structure from collision of a particle,
      the particle has a dimension of d in meter, a density of $\rho$ in kg/m$^3$ and a collision velocity of v in m/s,
      first protection film has a thickness of h in meter,
      the first protection film is made of material having a yielding strain of $\epsilon_B$ and a nano indentation hardness of Ha in kgf/m$^2$,
      the nano indentation hardness is obtained by using a Berkovich tip with applying load of 0.5 gf,
      the nano indentation hardness of the first protection film satisfies a following relationship:

$$Ha > c' \cdot \frac{d^3 \cdot \rho \cdot v^2}{h^3 \cdot \varepsilon_B},$$

the c' in the relationship represents a constant in a range of $5.5 \times 10^{-6} \leq c' \leq 7.6 \times 10^{-6}$,
   the first protection film is made of at least one of SiN, TiN, DLC, CBN, TiC, SiC, CrN, TiCN, SiON and TiAlN, and
   the micro system structure includes a diaphragm structure.

2. The method according to claim 1, further comprising the step of:
   forming a diaphragm structure by etching the substrate anisotropically from a backside of the substrate after the step of forming the first protection film.

3. The method according to claim 2, wherein
   the diaphragm is a silicon diaphragm or a thin film diaphragm.

4. The method according to claim 1, further comprising the step of:
   etching the substrate anisotropically from a backside of the substrate by using a KOH solution or a TMAH solution.

5. The method according to claim 1, further comprising the steps of:
   forming a second protection film on the micro system structure before the step of forming the first protection film;
   heating the first and the second protection films up to a predetermined temperature after the step of forming the first protection film; and
   cooling the first and the second protection films down to a room temperature, wherein
      the second protection film has a fluidizing temperature, which is lower than that of the first protection film,
      the first protection film is formed on the second protection film, and
      the predetermined temperature in the step of heating the first and the second protection films is equal to or higher than the fluidizing temperature of the second protection film.

6. The method according to claim 5, wherein
   the second protection film is formed by a PVD method, a CVD method, an ion plating method, an evaporation method, an ALD method, a spin coating method, or a printing method.

7. The method according to claim 1, further comprising the step of:
   forming a third protection film on the micro system structure before the step of forming the first protection film, wherein the first protection film is formed on the third protection film, and the third protection film has compressive stress.

8. The method according to claim 7, wherein
the third protection film is formed by a PVD method, a CVD method, an ion plating method, an evaporation method, an ALD method, a spin coating method, or a printing method.

9. method according to claim 1, wherein
the dimension of d is 100 μm, the density of ρ is 2.2g/cm³, and the collision velocity of v is 40 m/s.

10. The method according to claim 9, wherein
the thickness of h is in a range between 0.1 μm and 30 μm,
the nano indentation hardness of Ha is equal to or larger than 13.64 GPa, and
the first protection film has total stress equal to or lower than 700 N/m.

11. The method according to claim 10, wherein
the diaphragm structure includes a thin film diaphragm without any opening, and
the thin film diaphragm is made of SiN.

12. A method for manufacturing a micro device having a micro system structure, comprising:

forming the micro system structure on a support substrate, the support substrate including a thin film diaphragm; and forming a first protection film, from a material including at least one of SiN, TiN, DLC, CBN, TiC, SiC, CrN, TiCN, SiON and TiAlN, on the micro system structure, the first protection film being formed by a PVD method, a CVD method, an ion plating method, an evaporation method, an ALD method, a spin coating method, or a printing method, and being able to protect the micro system structure from collision by a particle upon satisfaction of the relationship $$Ha > c' \cdot \frac{d^3 \cdot \rho \cdot v^2}{h^3 \cdot \varepsilon_B},$$

wherein
Ha=a nano indentation hardness measured in kgf/meter²,
d=a dimension of the particle measured in meters,
ρ=a density of the particle measured in kilogram/meters³,
v=a collision velocity measured in meters/second,
h=a thickness of the first protection film measured in meters,
$\varepsilon_B$=a yielding strain of the material from which the first protection film is formed, and
c'=a constant in a range of $5.5 \times 10^{-6} \leq c' \leq 7.6 \times 10^{-6}$,
the nano indentation hardness being obtained using a Berkovich tip applying a load of 0.5 gf.

* * * * *